United States Patent
Choi et al.

(10) Patent No.: US 12,204,773 B2
(45) Date of Patent: Jan. 21, 2025

(54) SEMICONDUCTOR DEVICE FOR PERFORMING PROGRAM OPERATION AND METHOD OF OPERATING THE SAME

(71) Applicant: SK hynix Inc., Icheon-si (KR)

(72) Inventors: Hyung Jin Choi, Icheon-si (KR); Chan Sik Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 160 days.

(21) Appl. No.: 17/979,421

(22) Filed: Nov. 2, 2022

(65) Prior Publication Data
US 2023/0409214 A1   Dec. 21, 2023

(30) Foreign Application Priority Data
Jun. 15, 2022   (KR) .......................... 10-2022-0072982

(51) Int. Cl.
G06F 3/06 (2006.01)
(52) U.S. Cl.
CPC .......... G06F 3/0625 (2013.01); G06F 3/0653 (2013.01); G06F 3/0679 (2013.01)

(58) Field of Classification Search
CPC .... G06F 3/0625; G06F 3/0653; G06F 3/0679; G11C 16/0483; G11C 16/26; G11C 2211/5642; G11C 11/5628; G11C 16/10; G11C 16/3459; G11C 16/24; G11C 16/3404
See application file for complete search history.

(56) References Cited

U.S. PATENT DOCUMENTS

2017/0271023 A1*   9/2017   Maejima ............ G11C 16/3436

FOREIGN PATENT DOCUMENTS

| KR | 100543424 B1 | 1/2006 |
| KR | 1020100085672 A | 7/2010 |

* cited by examiner

*Primary Examiner* — Xiaochun L Chen
(74) *Attorney, Agent, or Firm* — WILLIAM PARK & ASSOCIATES LTD.

(57) ABSTRACT

A semiconductor device, and a method of operating the same, includes a memory cell array, a peripheral circuit, and control logic. The memory cell array includes a plurality of memory cells. The peripheral circuit is configured to perform a program operation on memory cells selected from among the plurality of memory cells. The control logic is configured to control the program operation of the peripheral circuit. The control logic is configured to control the peripheral circuit to precharge bit lines respectively coupled to the selected memory cells to different voltage levels during a verify operation included in the program operation.

12 Claims, 16 Drawing Sheets

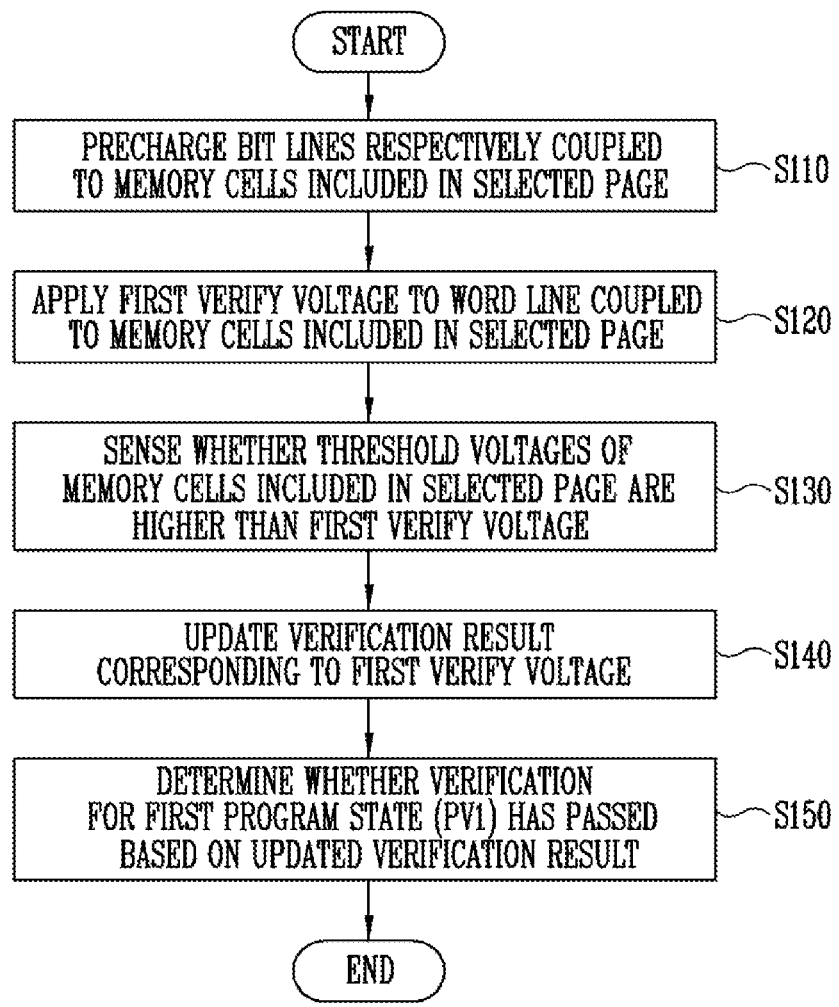

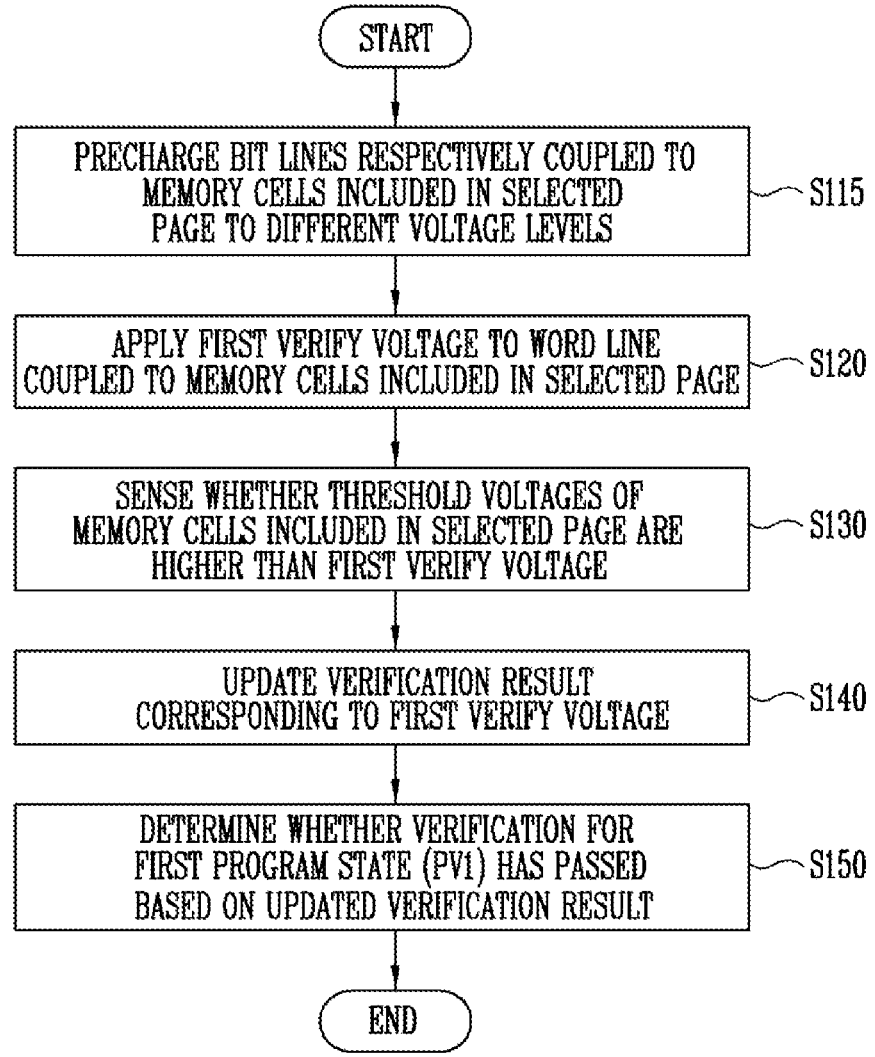

SEMICONDUCTOR DEVICE FOR PERFORMING PROGRAM OPERATION AND METHOD OF OPERATING THE SAME

CROSS-REFERENCE TO RELATED APPLICATION

The present application claims priority under 35 U.S.C. § 119(a) to Korean patent application number 10-2022-0072982, filed on Jun. 15, 2022, in the Korean Intellectual Property Office, the entire disclosure of which is incorporated herein by reference.

BACKGROUND

1. Technical Field

Various embodiments of the present disclosure relate to an electronic device, and more particularly, to a semiconductor device for performing a program operation and a method of operating the semiconductor device.

2. Related Art

A semiconductor memory device may have a two-dimensional (2D) structure in which strings are horizontally arranged on a semiconductor substrate. Alternatively, the semiconductor memory device may have a three-dimensional (3D) structure in which strings are vertically stacked on a semiconductor substrate. As memory devices having a 2D structure are reaching their physical scaling limit (i.e., limit in the degree of integration), 3D memory devices including a plurality of memory cells vertically stacked on a semiconductor substrate are being produced.

A program operation performed on selected memory cells may include the step of applying a program voltage and a verify step. At the verify step, bit lines coupled to the selected memory cells may be precharged. Here, bit lines coupled to memory cells that do not require a verify operation may be precharged to the same voltage level as bit lines coupled to memory cells that require a verify operation. This is the cause of increasing current consumed at the verify step for the memory cells.

SUMMARY

Various embodiments of the present disclosure are directed to a semiconductor device that is capable of reducing or minimizing current required for a program operation, and a method of operating the semiconductor device.

In accordance with an embodiment of the present disclosure, a semiconductor device may include a memory cell array, a peripheral circuit, and control logic. The memory cell array may include a plurality of memory cells. The peripheral circuit may be configured to perform a program operation on memory cells selected from among the plurality of memory cells. The control logic may be configured to control the program operation of the peripheral circuit. The control logic may control the peripheral circuit to precharge bit lines respectively coupled to the selected memory cells to different voltage levels during a verify operation included in the program operation. Current required for the program operation including the verify operation may be minimized by precharging some of the bit lines to a relatively low voltage level.

In an embodiment, the control logic may control the peripheral circuit to precharge the bit lines to different voltage levels based on whether the verify operation using the verify voltage is required. Current required for the verify operation may be minimized by precharging bit lines coupled to memory cells that do not require the verify operation to a relatively low voltage level.

In accordance with the present disclosure, a method of operating a semiconductor device may include precharging bit lines respectively coupled to memory cells included in a selected page to different voltage levels, applying a verify voltage to a word line coupled to the memory cells included in the selected page, and determining whether threshold voltages of the memory cells included in the selected page are higher than the verify voltage.

In an example, precharging the bit lines respectively coupled to the memory cells included in the selected page to different voltage levels may include precharging the bit lines to different voltage levels based on whether a verify operation using the verify voltage is required.

BRIEF DESCRIPTION OF THE DRAWINGS

FIG. 7 is a flowchart illustrating an example embodiment of a verify operation included in the program operation of a semiconductor memory device.

FIGS. 9A and 9B are diagrams for describing threshold voltages and program data of selected memory cells.

FIG. 10 is a flowchart illustrating a verify operation of a semiconductor memory device according to an embodiment of the present disclosure.

DETAILED DESCRIPTION

Specific structural or functional descriptions of the specific embodiments introduced in the present disclosure are provided as examples to describe the present teaching. Embodiments according to the concept of the present disclosure may be practiced in various forms and should not be construed as being limited to the specific embodiments introduced in the present disclosure.

Figure 1:
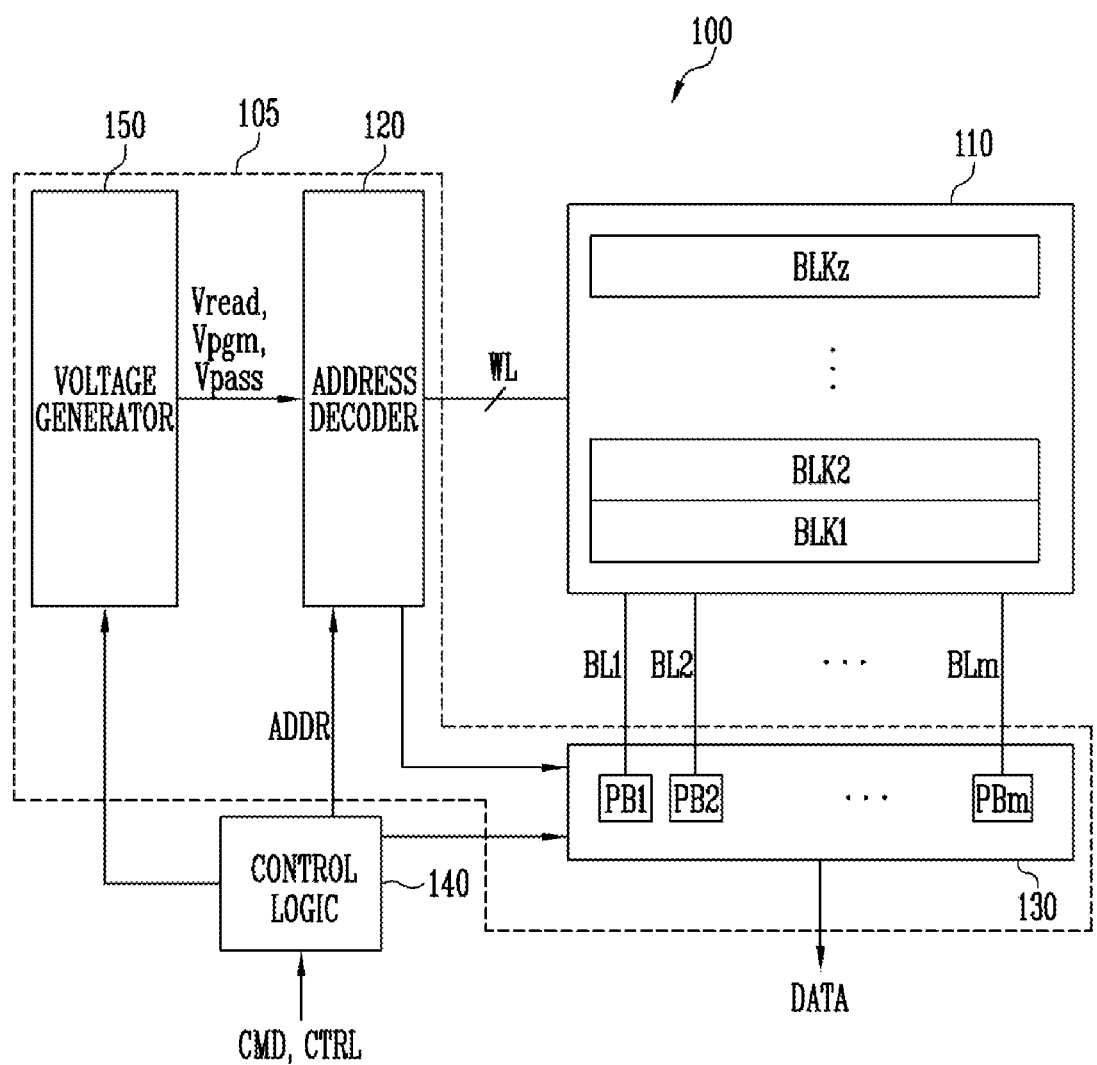
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 100 may include a memory cell array 110, an address decoder 120, a read and write circuit 130, control logic 140, and a voltage generator 150.

The memory cell array 110 may include a plurality of memory blocks BLK1 to BLKz. The memory blocks BLK1 to BLKz are coupled to the address decoder 120 through word lines WLs. The memory blocks BLK1 to BLKz are coupled to the read and write circuit 130 through bit lines BL1 to BLm. Each of the memory blocks BLK1 to BLKz includes a plurality of memory cells. In an embodiment, the plurality of memory cells may be nonvolatile memory cells and may be implemented as nonvolatile memory cells having a vertical channel structure. The memory cell array 110 may be implemented as a memory cell array having a two-dimensional (2D) structure. In an embodiment, the memory cell array 110 may be implemented as a memory cell array having a three-dimensional (3D) structure. Meanwhile, each of the memory cells included in the memory cell array may store at least one bit of data. In an embodiment, each of the memory cells included in the memory cell array 110 may be a single-level cell (SLC), which stores one bit of data. In an embodiment, each of the memory cells included in the memory cell array 110 may be a multi-level cell (MLC), which stores 2 bits of data. In an embodiment, each of the memory cells included in the memory cell array 110 may be a triple-level cell (TLC), which stores 3 bits of data. In an embodiment, each of the memory cells included in the memory cell array 110 may be a quad-level cell (QLC), which stores 4 bits of data. In accordance with an embodiment, the memory cell array 110 may include a plurality of memory cells, each of which stores 5 or more bits of data.

The address decoder 120, the read and write circuit 130, and the voltage generator 150 are operated as a peripheral circuit 105 for driving the memory cell array 110. The peripheral circuit 105 may perform a read operation, a write operation, and an erase operation on the memory cell array 110 under the control of the control logic 140. The address decoder 120 may be coupled to the memory cell array 110 through the word lines WLs. The address decoder 120 may be operated under the control of the control logic 140. The address decoder 120 receives addresses through an input/output buffer (not illustrated) provided in the semiconductor memory device 100.

The address decoder 120 may decode a block address, among the received addresses. The address decoder 120 selects at least one memory block based on the decoded block address. When a read voltage apply operation is performed during a read operation, the address decoder 120 may apply a read voltage Vread, generated by the voltage generator 150, to a selected word line of the selected memory block, and may apply a pass voltage Vpass to the remaining word lines, that is, unselected word lines. Further, during a program verify operation, the address decoder 120 may apply a verify voltage, generated by the voltage generator 150, to the selected word line of the selected memory block, and may apply the pass voltage Vpass to the remaining word lines, that is, unselected word lines.

The address decoder 120 may decode a column address, among the received addresses. The address decoder 120 may transmit the decoded column address to the read and write circuit 130.

The read and program operations of the semiconductor memory device 100 are each performed on a page basis. Addresses received in response to requests for the read and program operations may include a block address, a row address, and a column address. The address decoder 120 may select one memory block and one word line according to the block address and the row address. The column address may be decoded by the address decoder 120 and may then be provided to the read and write circuit 130.

The address decoder 120 may include a block decoder, a row decoder, a column decoder, an address buffer, etc.

The read and write circuit 130 includes a plurality of page buffers PB1 to PBm. The read and write circuit 130 may be operated as a "read circuit" during a read operation of the memory cell array 110 and as a "write circuit" during a write operation thereof. The plurality of page buffers PB1 to PBm may be coupled to the memory cell array 110 through the bit lines BL1 to BLm. To sense threshold voltages of the memory cells during a read operation and a program verify operation, each of the page buffers PB1 to PBm may sense, through a sensing node, a change in the amount of flowing current depending on the program state of the corresponding memory cell and latch the sensed change as sensing data while continuously supplying sensing current to the bit lines coupled to the memory cells. The read and write circuit 130 is operated in response to page buffer control signals output from the control logic 140.

During a read operation, the read and write circuit 130 may sense data stored in the memory cells and temporarily store read data and may then output data DATA to the input/output buffer (not illustrated) of the semiconductor memory device 100. In an example embodiment, the read and write circuit 130 may include a column select circuit or the like as well as the page buffers (or page registers). An example embodiment of the page buffer 131 coupled to the first bit line BL1, among the plurality of page buffers included in the read and write circuit 130, will be described in detail later with reference to FIG. 15.

The control logic 140 is coupled to the address decoder 120, the read and write circuit 130, and the voltage generator 150. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL. Also, the control logic 140 may output a control signal for controlling the precharge potential level of the sensing node of the plurality of page buffers PB1 to PBm. The control logic 140 may control the read and write circuit 130 to perform a read operation on the memory cell array 110. The control logic 140 may be implemented as hardware, software, or a combination of hardware and software. For example, the control logic 140 may be a control logic circuit operating in accordance with an algorithm and/or a processor executing control logic code.

The voltage generator 150 may generate the read voltage Vread and the pass voltage Vpass required for a read operation in response to the control signal output from the control logic 140. The voltage generator 150 may include a plurality of pumping capacitors for receiving an internal supply voltage to generate a plurality of voltages having various voltage levels and may generate a plurality of voltages by selectively enabling the plurality of pumping capacitors under the control of the control logic 140. Meanwhile, the voltage generator 150 may further include a voltage regulator in addition to the plurality of pumping capacitors.

Figure 2:
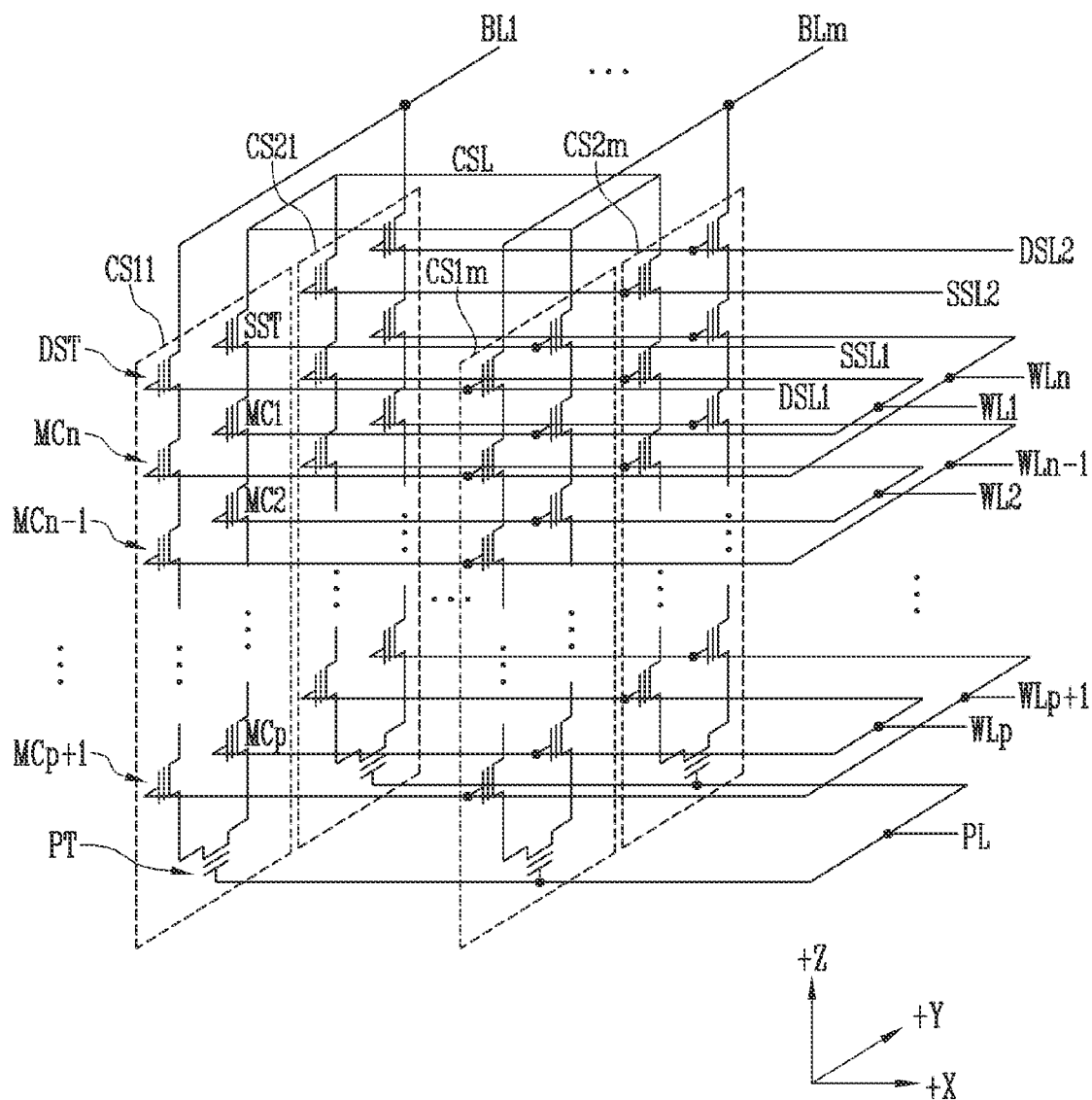
FIG. 2 is a circuit diagram illustrating any one memory block BLKa of the memory blocks BLK1 to BLKz of FIG. 1.

FIG. 2 is a circuit diagram illustrating any one memory block BLKa of the memory blocks BLK1 to BLKz of FIG. 1.

Referring to FIG. 2, the memory block BLKa may include a plurality of cell strings CS11 to CS1*m* and CS21 to CS2*m*. In an embodiment, each of the cell strings CS11 to CS1*m* and CS21 to CS2*m* may be formed in a 'U' shape. In the memory block BLKa, m cell strings may be arranged in a row direction (i.e., a positive (+) X direction). In FIG. 2, two cell strings are illustrated as being arranged in a column direction (i.e., a positive (+) Y direction). However, this illustration is provided for convenience of description, and it will be understood that three or more cell strings may be arranged in the column direction.

Each of the plurality of cell strings CS11 to CS1*m* and CS21 to CS2*m* includes at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged in the same row are coupled to a source select line extending in a row direction, and the source select transistors of cell strings arranged in different rows are coupled to different source select lines. In FIG. 2, the source select transistors of the cell strings CS11 to CS1*m* in a first row are coupled to a first source select line SSL1. The source select transistors of the cell strings CS21 to CS2*m* in a second row are coupled to a second source select line SSL2.

In an embodiment, the source select transistors of the cell strings CS11 to CS1*m* and CS21 to CS2*m* may be coupled in common to one source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite to a positive (+) Z direction and are coupled in series between the source select transistor SST and the pipe transistor PT. The p+1-th to n-th memory cells MCp+1 to MCn are sequentially arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. Gates of the first to n-th memory cells MC1 to MCn of each cell string are coupled to the first to n-th word lines WL1 to WLn, respectively.

A gate of the pipe transistor PT of each cell string is coupled to a pipeline PL.

The drain select transistor DST of each cell string is coupled between the corresponding bit line and the memory cells MCp+1 to MCn. The drain select transistor of the cell strings arranged in the row direction are coupled to drain select lines extending in the row direction. The drain select transistors of the cell strings CS11 to CS1*m* in the first row are coupled to a first drain select line DSL1. The drain select transistors of the cell strings CS21 to CS2*m* in the second row are coupled to a second drain select line DSL2.

Cell strings arranged in the column direction may be coupled to bit lines extending in the column direction. In FIG. 2, the cell strings CS11 and CS21 in a first column are coupled to a first bit line BL1. The cell strings CS1*m* and CS2*m* in an m-th column are coupled to an m-th bit line BLm.

Memory cells coupled to the same word line in cell strings arranged in the row direction form one page. For example, memory cells coupled to the first word line WL1, among the cell strings CS11 to CS1*m* in the first row, form one page. Memory cells coupled to the first word line WL1, among the cell strings CS21 to CS2*m* in the second row, form one additional page. Cell strings arranged in the direction of one row may be selected by selecting any one of the drain select lines DSL1 and DSL2. One page may be selected from the selected cell strings by selecting any one of the word lines WL1 to WLn.

In an embodiment, instead of the first to m-th bit lines BL1 to BLm, even bit lines and odd bit lines may be provided. Even-numbered cell strings, among the cell strings CS11 to CS1*m* or CS21 to CS2*m* arranged in a row direction, may be coupled to respective even bit lines. Odd-numbered cell strings, among the cell strings CS11 to CS1*m* or CS21 to CS2*m* arranged in the row direction, may be coupled to respective odd bit lines.

In an embodiment, one or more of first to n-th memory cells MC1 to MCn may be used as dummy memory cells. For example, the one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As the number of dummy memory cells that are provided is increased, the reliability of operation of the memory block BLKa may be improved, whereas the size of the memory block BLKa may be increased. As the number of dummy memory cells that are provided is decreased, the size of the memory block BLKa may decrease, while the reliability of operation of the memory block BLKa may deteriorate.

To efficiently control the one or more dummy memory cells, respective dummy memory cells may have required threshold voltages. Before or after an erase operation on the memory block BLKa is performed, program operations may be performed on all or some of the dummy memory cells.

Figure 3:
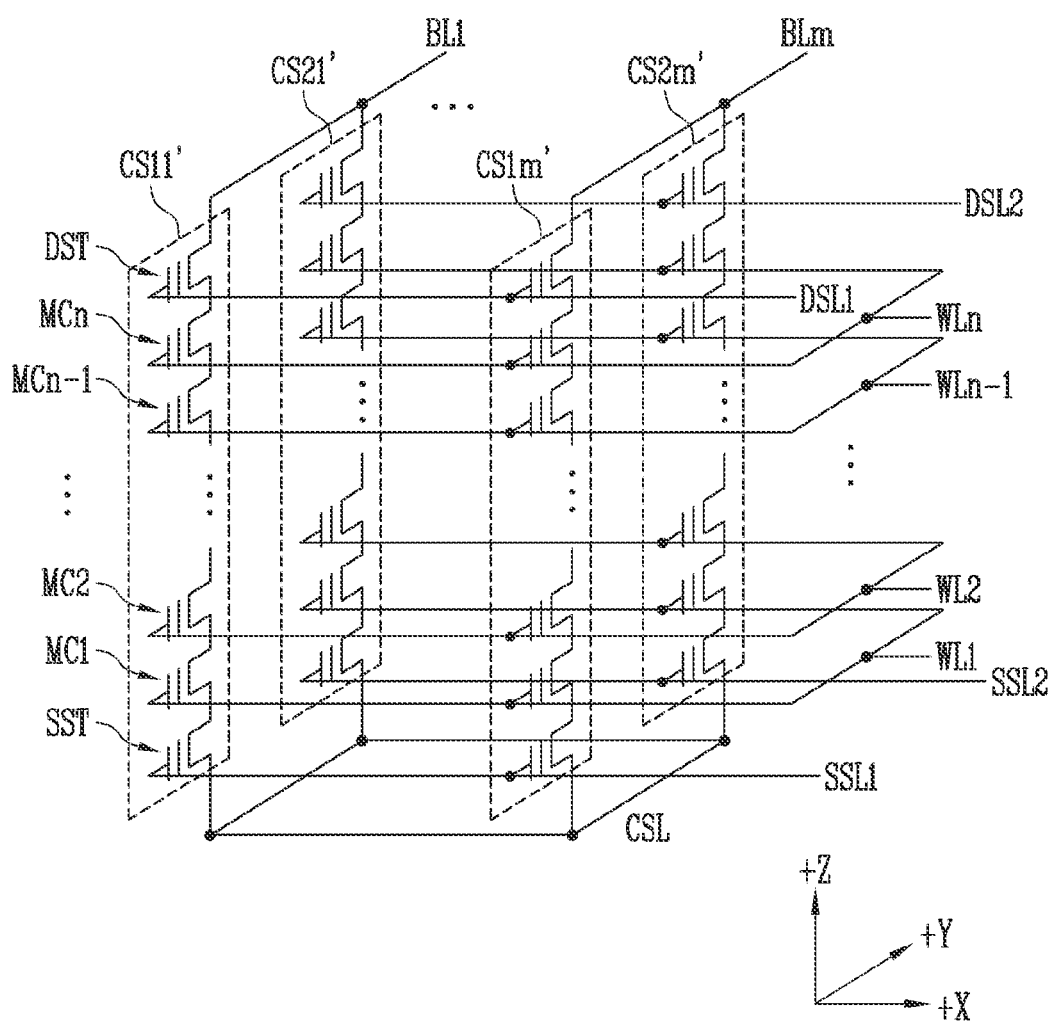
FIG. 3 is a circuit diagram illustrating an example of any one memory block BLKb of the memory blocks BLK1 to BLKz of FIG. 1.

FIG. 3 is a circuit diagram illustrating an example of any one memory block BLKb of the memory blocks BLK1 to BLKz of FIG. 1.

Referring to FIG. 3, the memory block BLKb may include a plurality of cell strings CS11' to CS1m' and CS21' to CS2m'. Each of the cell strings CS11' to CS1m' and CS21' to CS2m' extends in a positive (+) Z direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

The source select transistor SST of each cell string is coupled between the common source line CSL and the memory cells MC1 to MCn. The source select transistors of cell strings arranged in the same row are coupled to the same source select line. The source select transistors of the cell strings CS11' to CS1m' arranged in a first row may be coupled to a first source select line SSL1. The source select transistors of the cell strings CS21' to CS2m' arranged in a second row may be coupled to a second source select line SSL2. In an embodiment, the source select transistors of the cell strings CS11' to CS1m' and CS21' to CS2m' may be coupled in common to one source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. The drain select transistors of cell strings arranged in the row direction may be coupled to drain select lines extending in the row direction. The drain select transistors of the cell strings CS11' to CS1m' in the first row are coupled to a first drain select line DSL1. The drain select transistors of the cell strings CS21' to CS2m' in the second row may be coupled to a second drain select line DSL2.

Consequentially, the memory block BLKb of FIG. 3 may have an equivalent circuit similar to that of the memory block BLKa of FIG. 2 except that a pipe transistor PT is excluded from each cell string.

In an embodiment, instead of the first to m-th bit lines BL1 to BLm, even bit lines and odd bit lines may be provided. Even-numbered cell strings, among the cell strings CS11' to CS1m' or CS21' to CS2m' arranged in a row direction, may be coupled to respective even bit lines. Odd-numbered cell strings, among the cell strings CS11' to CS1m' or CS21' to CS2m' arranged in the row direction, may be coupled to respective odd bit lines.

In an embodiment, one or more of first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As the number of dummy memory cells that are provided increases, the reliability of operation of the memory block BLKb may be improved, whereas the size of the memory block BLKb may increase. As the number of dummy memory cells that are provided decreases, the size of the memory block BLKb may decrease, whereas the reliability of operation of the memory block BLKb may deteriorate.

To efficiently control the one or more dummy memory cells, respective dummy memory cells may have required threshold voltages. Before or after an erase operation on the memory block BLKb is performed, program operations may be performed on all or some of the dummy memory cells.

Figure 4:
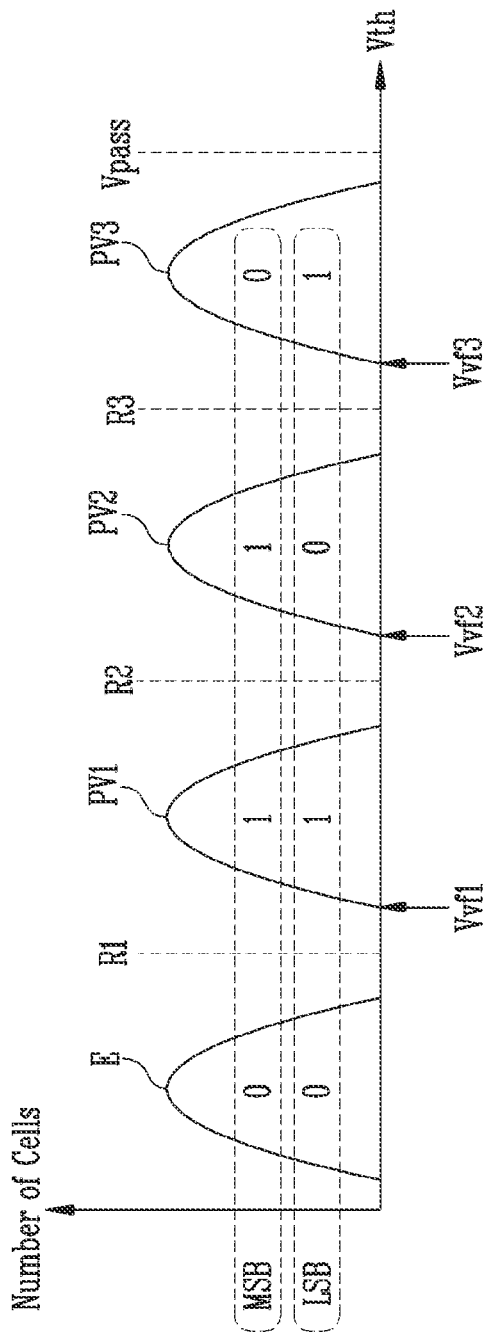
FIG. 4 is a diagram for describing threshold voltage distributions of multi-level cells (MLC) and verify voltages for forming the threshold voltage distributions.

FIG. 4 is a diagram for describing threshold voltage distributions of multi-level cells (MLC) and verify voltages for forming the threshold voltage distributions.

Referring to FIG. 4, data patterns stored in each multi-level cell and threshold voltage distributions of target states corresponding to the data patterns are illustrated by way of example. The multi-level cell (MLC) may store two bits of data including a most significant bit (MSB) and a least significant bit (LSB). In the example of FIG. 4, a memory cell corresponding to an erased state E may store a data pattern of "0 0", a memory cell corresponding to a first program state PV1 may store a data pattern of "1 1", a memory cell corresponding to a second program state PV2 may store a data pattern of "1 0", and a memory cell corresponding to a third program state PV3 may store a data pattern of "0 1". To read data from the multi-level cell (MLC), first to third read voltages R1 to R3 may be used. Meanwhile, a pass voltage Vpass may be applied to unselected word lines.

During a program verify operation, verify voltages Vvf1, Vvf2, and Vvf3 may be used. In an example, a program enable voltage is applied to bit lines coupled to memory cells having threshold voltages lower than the first verify voltage Vvf1, among the memory cells to be programmed to the first program state PV1. In an embodiment, the program enable voltage may be a ground voltage. Further, a program-inhibit voltage is applied to bit lines coupled to memory cells having threshold voltages higher than the first verify voltage Vvf1. The program-inhibit voltage is a voltage higher than the program enable voltage. In an embodiment, the program-inhibit voltage may be a supply voltage.

While a program voltage is applied to the selected word line, the threshold voltages of memory cells coupled to the bit lines to which the program-inhibit voltage is applied are maintained. Meanwhile, while the program voltage is applied to the selected word line, the threshold voltages of memory cells coupled to the bit lines to which the program enable voltage is applied are increased.

In the above description, although the first program state PV1 is described as an example, a program operation for the second and third program states PV2 and PV3 may be performed in the same manner as the first program state PV1.

Hereinafter, a semiconductor memory device according to the present disclosure and the operation thereof will be described based on a program operation performed on a multi-level cell (MLC) for convenience of description. However, the present disclosure is not limited thereto, and may also be applied to a program operation on a single-level cell (SLC), a triple-level cell (TLC), or the like.

Figure 5:
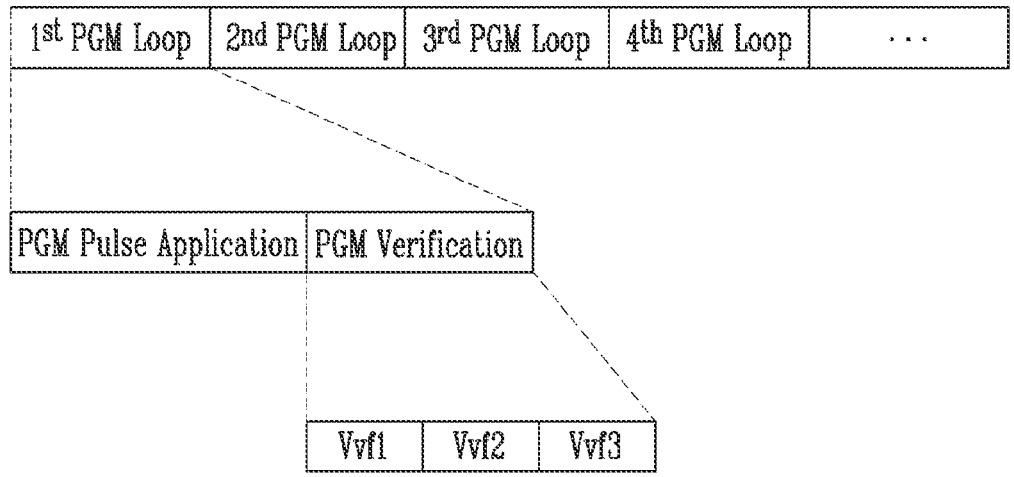
FIG. 5 is a diagram for describing a plurality of program loops included in a program operation of a semiconductor memory device.

FIG. 5 is a diagram illustrating a plurality of program loops included in a program operation of a semiconductor memory device.

Referring to FIG. 5, the program operation of the semiconductor memory device may include a plurality of program loops. As illustrated in FIG. 5, a first program loop ($1^{st}$ PGM Loop) may be performed. After the first program loop ($1^{st}$ PGM Loop) has been performed, a second program loop ($2^{nd}$ PGM Loop) may be performed unless a program operation performed on memory cells included in a selected page is completed. After the second program loop ($2^{nd}$ PGM Loop) has been performed, a third program loop ($3^{rd}$ PGM Loop) may be performed unless a program operation performed on memory cells included in the selected page is completed. In this manner, until the program operation performed on the memory cells included in the selected page is completed or until the current program loop reaches the maximum program loop, a plurality of program loops may be repeated.

Meanwhile, the program operation of the semiconductor memory device may be performed using an incremental step pulse programming (ISPP) scheme. The ISPP scheme may be a scheme for programming memory cells while gradually increasing a program voltage. As the number of program loops that are performed is iterated, the program voltage applied in each program loop may gradually increase.

Meanwhile, as illustrated in FIG. 5, each of the plurality of program loops may include a program pulse apply step (PGM Pulse Application) and a program verify step (PGM Verification). At the program pulse apply step, threshold voltages of program enable cells may be increased by applying a program voltage to a selected word line.

At the program verify step, whether memory cells selected as a program target have been programmed to a verify voltage at a desired level or more may be verified. As a result of the verify operation, a memory cell which is not programmed to the verify voltage or more may be operated as a program-enabled cell in a subsequent program loop. Here, a program pulse having a voltage level higher than that in a previous program loop may be applied to program-enabled cells. Meanwhile, a memory cell which is programmed to the verify voltage or more may be operated as a program-inhibited cell in a subsequent program loop. Even if the program pulse is applied to the selected word line, the threshold voltage of the program-inhibited cell might not increase.

As described above, at the program verify step, verify voltages Vvf1, Vvf2, and Vvf3 may be used. As illustrated in FIG. 5, at the program verify step, the first verify voltage Vvf1, the second verify voltage Vvf2, and the third verify voltage Vvf3 may be sequentially applied to the selected word line. However, this is only an example, and at a program verify step included in each program loop, only some of the first verify voltage Vvf1, the second verify voltage Vvf2, and the third verify voltage Vvf3 may be used.

Hereinafter, a description will be made in detail with reference to FIGS. 6A and 6B.

Figure 6A:
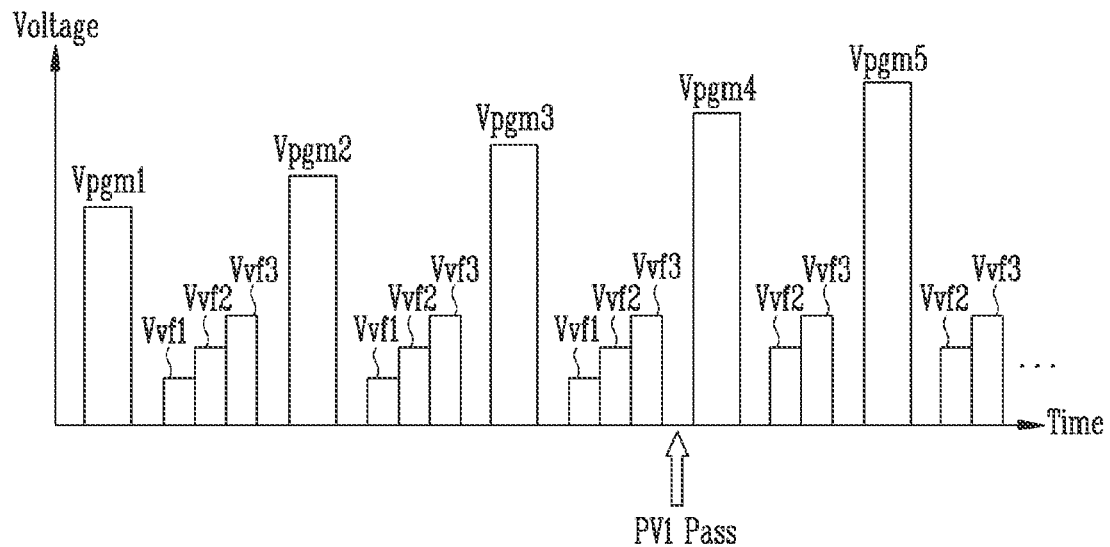
FIGS. 6A and 6B are diagrams for describing voltages applied to a selected word line during a program operation.
Figure 6B:
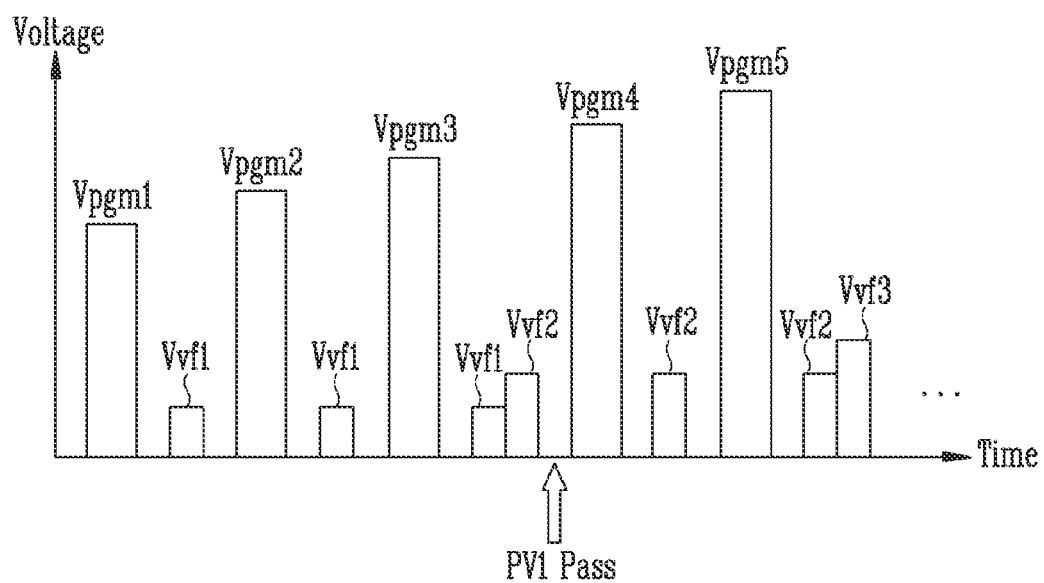

FIGS. 6A and 6B are diagrams for describing voltages applied to a selected word line during a program operation. Referring to FIGS. 6A and 6B, a program operation for forming the program states of FIG. 4 may include a plurality of program loops.

Referring to FIG. 6A, at a program pulse apply step in a first program loop, a first program voltage Vpgm1 is applied to a selected word line. Further, at a verify step in the first program loop, first to third verify voltages Vvf1 to Vvf3 may be sequentially applied to the selected word line.

Thereafter, at a program pulse apply step in a second program loop, a second program voltage Vpgm2 may be applied to the selected word line, and at the verify step, first to third verify voltages Vvf1 to Vvf3 may be applied to the selected word line.

Thereafter, at a program pulse apply step in a third program loop, a third program voltage Vpgm3 may be applied to the selected word line. Further, at a verify step in the third program loop, first to third verify voltages Vvf1 to Vvf3 may be applied to the selected word line.

Referring to FIG. 6A, it is illustrated that, as a result of performing the verify step in the third program loop, verification for the first program state PV1 has passed. Therefore, in subsequent program loops, the first verify voltage Vvf1 might not be used. Accordingly, at a program pulse apply step in a fourth program loop, a fourth program voltage Vpgm4 may be applied to the selected word line, and at the verify step, second and third verify voltages Vvf2 and Vvf3 may be applied to the selected word line. This process may be repeated until verification for the second and third program states PV2 and PV3 is completed.

Referring to FIG. 6A, an embodiment in which one or more verify voltages are applied to the selected word line in the order in which the voltages are sequentially increased from a low voltage to a high voltage is illustrated. However, this is only an example, and the present disclosure is not limited thereto. For example, a plurality of verify voltages may be applied to the selected word line in the order in which the voltages are sequentially decreased from a high voltage to a low voltage.

In an initial stage of the program operation, memory cells programmed to second and third program states might not be present. Accordingly, in the first program loop ($1^{st}$ PGM Loop), a verify operation may be performed using only the first verify voltage Vvf1. Referring to FIG. 6B, at a program pulse apply step in a first program loop, a first program voltage Vpgm1 is applied to a selected word line. Further, at a verify step in the first program loop, the first verify voltage Vvf1 may be applied to the selected word line.

Thereafter, at a program pulse apply step in a second program loop, a second program voltage Vpgm2 may be applied to the selected word line, and at the verify step, the first verify voltage Vvf1 may be applied to the selected word line.

Thereafter, at a program pulse apply step in a third program loop, a third program voltage Vpgm3 may be applied to the selected word line. Further, at a verify step in the third program loop, first and second verify voltages Vvf1 and Vvf2 may be applied to the selected word line.

Referring to FIG. 6B, it is illustrated that, as a result of performing the verify step in the third program loop, verification for the first program state PV1 has passed. Therefore, in subsequent program loops, the first verify voltage Vvf1 might not be used. Accordingly, at a program pulse apply step in a fourth program loop, a fourth program voltage Vpgm4 may be applied to the selected word line, and at the verify step, a second verify voltage Vvf2 may be applied to the selected word line.

Thereafter, at a program pulse apply step in a fifth program loop, a fifth program voltage Vpgm5 may be applied to the selected word line. At a verify step in the fifth program loop, the second and third verify voltages Vvf2 and Vvf3 may be applied to the selected word line. In this way, the program loops may be repeatedly performed until verification for a second program state PV2 and a third program state PV3 passes. This process may be repeated until verification for the second and third program states PV2 and PV3 is completed.

According to the embodiment illustrated in FIG. 6B, because verification for the second and third program states PV2 and PV3 is not performed in an initial program loop, the overall program speed may be improved.

FIG. 7 is a flowchart illustrating an example embodiment of a verify operation included in a program operation of a semiconductor memory device.

Referring to FIG. 7, an example of a verify operation for a first program state PV1 is illustrated. For example, a verify operation for the first program state PV1, included in a first program loop, may include precharging bit lines respectively coupled to memory cells included in a selected page at step S110, applying a first verify voltage Vvf1 to a word line coupled to the memory cells included in the selected page at step S120, sensing whether threshold voltages of the memory cells included in the selected page are higher than the first verify voltage at step S130, updating the result of verification corresponding to the first verify voltage at step S140, and determining whether verification for the first program state PV1 has passed based on the updated verification result at step S150.

At step S110, to verify the memory cells included in the selected page, the bit lines coupled to the memory cells may be precharged. In detail, page buffers coupled to respective bit lines may increase the voltages of the bit lines coupled thereto using a supply voltage.

At step S120, the first verify voltage Vvf1 may be applied to a word line coupled to the memory cells included in the selected page in the state in which the bit lines are precharged. As the first verify voltage Vvf1 is applied to the selected word line, the memory cells included in the selected page may be selectively turned on or off. In detail, a memory cell having a threshold voltage lower than the first verify voltage Vvf1 may be turned on, and a memory cell having a threshold voltage higher than the first verify voltage Vvf1 may be turned off.

At step S130, different voltages or currents may be sensed from respective bit lines depending on the turn-on or turn-off operation of each of the memory cells. Whether the corresponding memory cells are turned on or turned off may be determined depending on the different voltages or currents.

At step S140, the result of verification corresponding to the first verify voltage may be updated. In detail, the bit values of latches in page buffers corresponding to the memory cells having threshold voltages higher than the first verify voltage may be updated.

At step S150, whether verification for the first program state PV1 has passed is determined based on the result of update at step S140. In detail, when the number of memory cells having threshold voltages higher than the first verify voltage Vvf1, among the memory cells to be programmed to the first program state PV1, is greater than the reference number of memory cells, it may be determined that verification for the first program state PV1 has passed. In this case, in a subsequent program loop, a verify operation for the first program state PV1 might not be performed. On the other hand, when the number of memory cells having threshold voltages higher than the first verify voltage Vvf1, among the memory cells to be programmed to the first program state PV1, is not greater than the reference number of memory cells, it may be determined that verification for the first program state PV1 has not passed. In this case, in a subsequent program loop, the verify operation for the first program state PV1 may be continuously performed.

Figure 8:
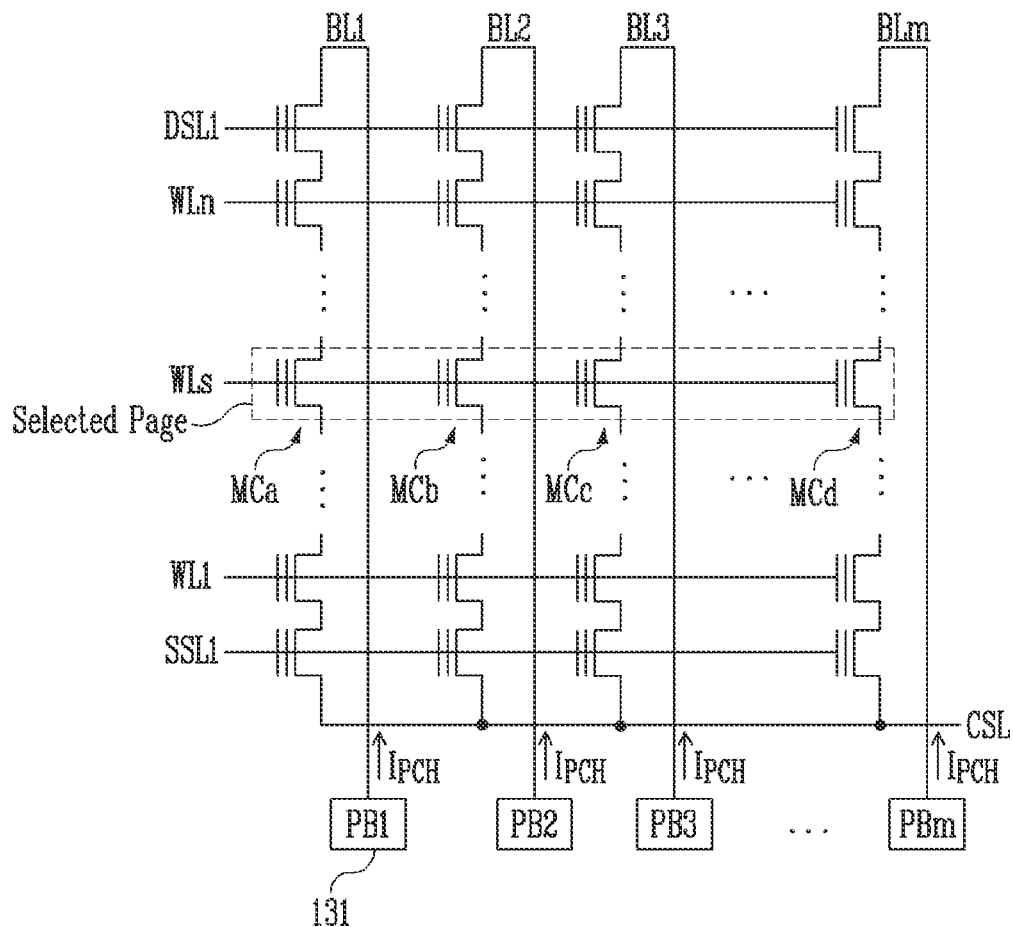
FIG. 8 is a circuit diagram for describing currents flowing through respective bit lines at step S110 of FIG. 7.

FIG. 8 is a circuit diagram for describing currents flowing through respective bit lines at step S110 of FIG. 7.

Referring to FIG. 8, memory cells MCa, MCb, MCc, . . . , MCd included in a selected page in a memory block are coupled to a selected word line WLs. Meanwhile, the bit lines BL1 to BLm are coupled to page buffers PB1 to PBm corresponding thereto, respectively. To precharge the bit lines BL1 to BLm, a precharge current $I_{PCH}$ may flow from the page buffers PB1 to PBm to the bit lines BL1 to BLm. Each of the bit lines BL1 to BLm may be precharged to a target voltage level due to the precharge current $I_{PCH}$. In an example embodiment, the bit lines BL1 to BLm may be precharged to the same voltage level regardless of the threshold voltages of the memory cells MCa, MCb, MCc, . . . , MCd or pieces of program data corresponding thereto.

Figure 9A:
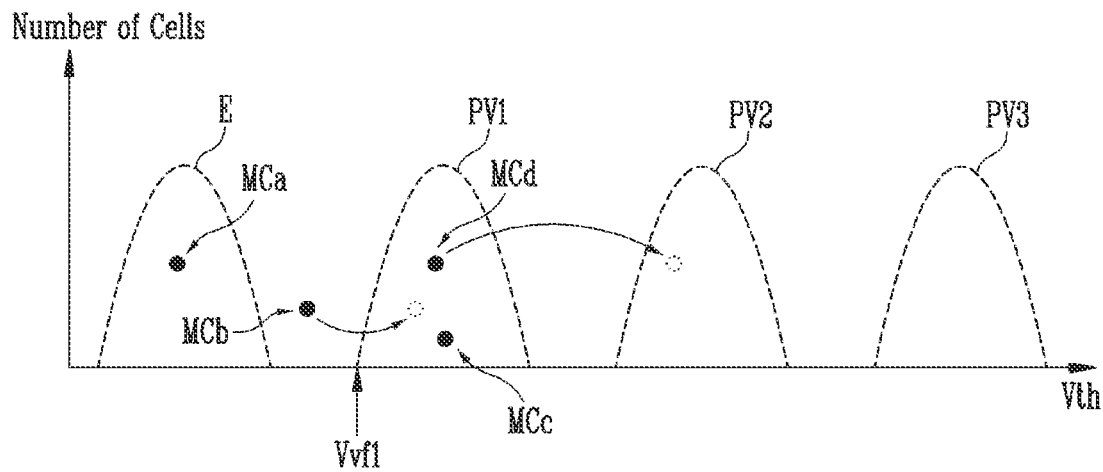

FIGS. 9A and 9B are diagrams for describing threshold voltages and program data of selected memory cells.

Referring to FIG. 9A, examples of the threshold voltages of memory cells MCa, MCb, MCc, . . . , MCd are illustrated. That is, the memory cells MCa and MCb have threshold voltages lower than a first verify voltage Vvf1, and the memory cells MCc and MCd have threshold voltages higher than the first verify voltage.

Referring to FIG. 9B, pieces of program data, that is, data patterns, respectively corresponding to the memory cells MCa, MCb, MCc, . . . , MCd, are illustrated. In detail, a data pattern corresponding to the memory cell MCa is "0 0", a data pattern corresponding to the memory cells MCb and MCc is "1 1", and a data pattern corresponding to the memory cell MCd is "1 0". Referring to FIG. 4 along with FIG. 9B, the target program state of the memory cell MCa is an erased state E, the target program state of the memory cells MCb and MCc is a first program state PV1, and the target program state of the memory cell MCd is a second program state PV2.

Referring back to FIG. 9A, the target program state of the memory cell MCa is the erased state E and the current threshold voltage of the memory cell MCa is included in the erased state E, and thus the threshold voltage of the memory cell MCa does not need to be increased. Therefore, the memory cell MCa does not require a verify operation using the first verify voltage Vvf1.

Meanwhile, the target program state of the memory cell MCb is the first program state PV1, but the current threshold voltage of the memory cell MCb is lower than the first verify voltage Vvf1. Therefore, the threshold voltage of the memory cell MCb needs to be increased and requires the verify operation using the first verify voltage Vvf1.

On the other hand, the target program state of the memory cell MCc is the first program state PV1, and the current threshold voltage of the memory cell MCc also belongs to the first program state PV1. Therefore, the threshold voltage of the memory cell MCc does not need to be increased. Because the memory cell MCc has already been programmed, the verify operation using the first verify voltage Vvf1 is not required.

Meanwhile, the target program state of the memory cell MCd is the second program state PV2. Therefore, the current threshold voltage of the memory cell MCd is higher than the first verify voltage Vvf1. The memory cell MCd requires a verify operation using a second verify voltage Vvf2 and does not require the verify operation using the first verify voltage Vvf1.

In summary, the memory cell requiring the verify operation using the first verify voltage Vvf1, among the memory cells MCa, MCb, MCc, and MCd, is the memory cell MCb. According to the verify operation described above with reference to FIGS. 7 and 8, during the verify operation using the first verify voltage Vvf1, bit lines coupled not only to the memory cell MCb but also to the memory cells MCa, MCc, and MCd that do not require a verify operation are precharged. Therefore, current consumed in a bit line precharge operation is increased, which results in an increase in power consumed by the semiconductor memory device during a program operation.

In accordance with the method of operating the semiconductor memory device according to an embodiment of the present disclosure, during a verify operation using a specific verify voltage, at least some of bit lines coupled to memory cells that do not require verification may be precharged to a relatively low voltage level. Accordingly, current consumed in a bit line precharge operation may be reduced, whereby power consumed by the semiconductor memory device during the program operation may be reduced or minimized.

FIG. 10 is a flowchart illustrating a verify operation of a semiconductor memory device according to an embodiment of the present disclosure.

Referring to FIG. 10, an example of a verify operation for a first program state PV1 is illustrated. The verify operation of the semiconductor memory device according to the present disclosure may include precharging bit lines respectively coupled to memory cells included in a selected page to different voltage levels at step S115, applying a first verify voltage Vvf1 to a word line coupled to the memory cells included in the selected page at step S120, sensing whether threshold voltages of the memory cells included in the selected page are higher than the first verify voltage at step S130, updating the result of verification corresponding to the first verify voltage at step S140, and determining whether verification for the first program state PV1 has passed based on the updated verification result at step S150.

Among the steps illustrated in FIG. 10, steps S120, S130, S140, and S150 are identical to those described in the verify operation illustrated in FIG. 7. Therefore, repeated descriptions of steps S120, S130, S140, and S150 are omitted.

At step S115, to verify the memory cells included in the selected page, the bit lines coupled to the memory cells may be precharged. Here, the respective bit lines may be precharged to different voltage levels based on whether each of the bit lines is a bit line coupled to a memory cell that requires a verify operation using the first verify voltage. In detail, current consumed in the bit line precharge operation may be reduced by decreasing the precharge voltage level of a bit line coupled to a memory cell that does not require the verify operation using the first verify voltage. Hereinafter, a description will be made in detail with reference to FIGS. 11 to 14B.

Figure 11:
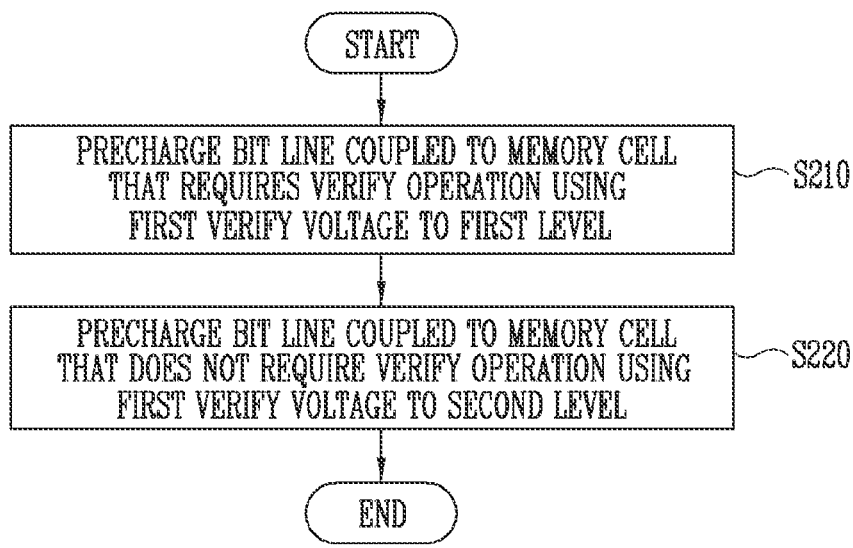
FIG. 11 is a flowchart illustrating an example of step S115 of FIG. 10.

FIG. 11 is a flowchart illustrating an example of step S115 of FIG. 10. Referring to FIG. 11, step S115 from FIG. 10 of precharging the bit lines respectively coupled to the memory cells included in the selected page to different voltage levels may include: precharging a bit line, coupled to a memory cell that requires the verify operation using the first verify voltage, to a first level at step S210; and precharging a bit line, coupled to a memory cell that does not require the verify operation using the first verify voltage, to a second level at step S220. Although, in FIG. 11, step S220 is illustrated as being performed after step S210 is performed, this is only an example, and the present disclosure is not limited thereto. For example, step S210 may be performed after step S220 is performed, and steps S210 and S220 may be substantially simultaneously performed.

At step S210, the bit lines coupled to memory cells that require the verify operation using the first verify voltage are precharged to a first voltage level. Accordingly, the bit line BL2 coupled to the memory cell MCb, described above with reference to FIGS. 9A and 9B, may be precharged to the first voltage level.

At step S220, at least some of the bit lines coupled to the memory cells that do not require the verify operation using the first verify voltage may be precharged to a second voltage level lower than the first voltage level. Accordingly, at least some of the bit lines BL1, BL3, and BLm coupled to the memory cells MCa, MCc, and MCd, described above with reference to FIGS. 9A and 9B, may be precharged to the second voltage level lower than the first voltage level.

In accordance with the present disclosure, the bit line coupled to a memory cell that absolutely requires the verify operation using the first verify voltage, that is, the memory cell MCb, may be precharged to the first voltage level. Meanwhile, at least some of the bit lines BL1, BL3, and BLm coupled to other memory cells MCa, MCc, and MCd may be precharged to the second voltage level. In accordance with an embodiment, all the bit lines BL1, BL3, and BLm coupled to other memory cells MCa, MCc, and MCd may be precharged to the second voltage level. A detailed description thereof will be made below with reference to FIGS. 12A to 14B.

Figure 12A:
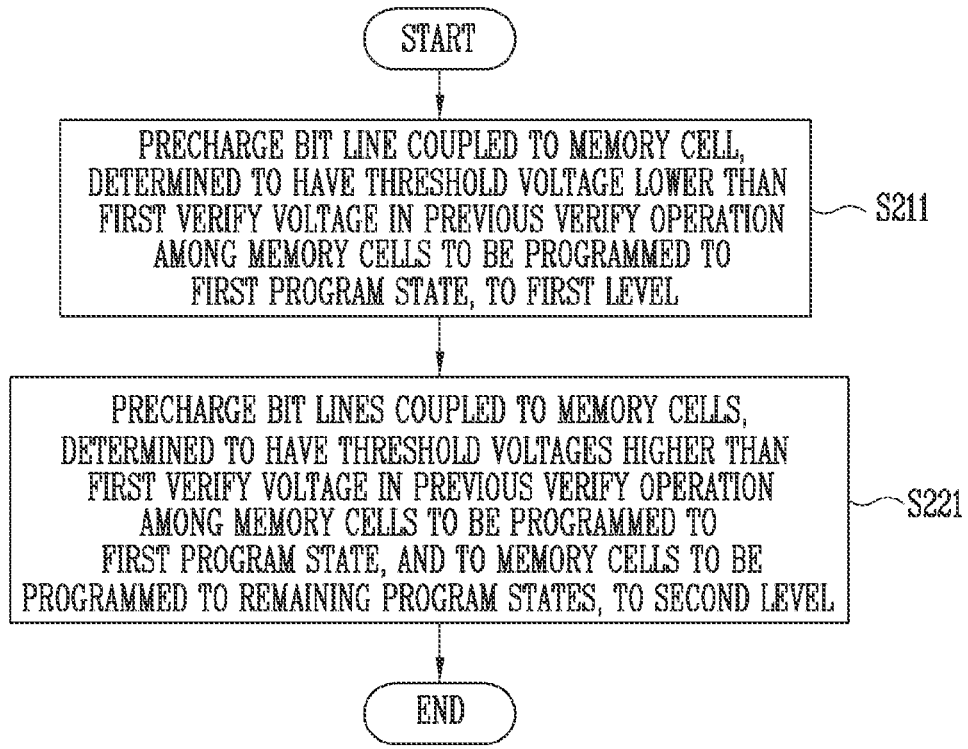
FIG. 12A is a flowchart illustrating an example of step S115 of FIG. 10.
Figure 12B:
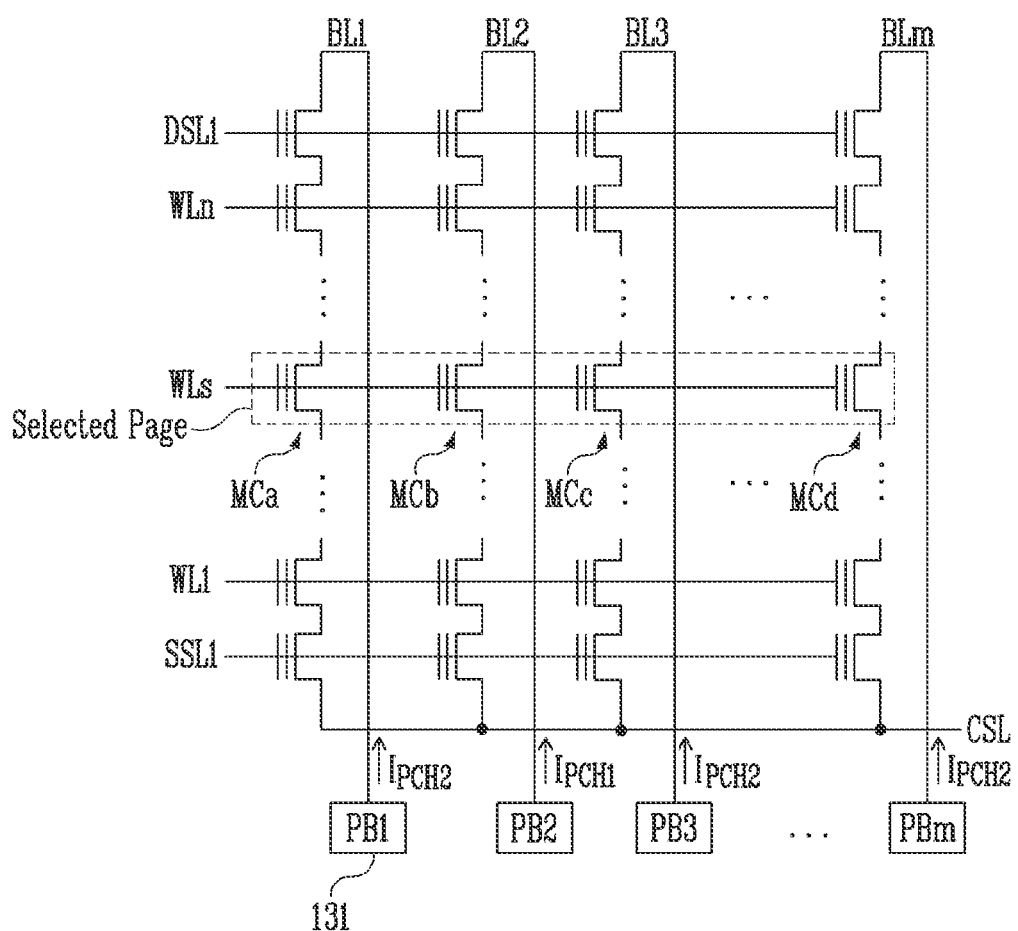
FIG. 12B is a circuit diagram for describing currents flowing through respective bit lines during the operation of the semiconductor memory device at steps S211 and S221 of FIG. 12A.

FIG. 12A is a flowchart illustrating an example of step S115 of FIG. 10. FIG. 12B is a circuit diagram for describing currents flowing through respective bit lines during the operation of the semiconductor memory device at steps S211 and S221 of FIG. 12A.

Referring to FIG. 12A, step S115 from FIG. 10 of precharging the bit lines respectively coupled to the memory cells included in the selected page to different voltage levels may include: precharging a bit line coupled to the memory cell MCb, determined to have a threshold voltage lower than the first verify voltage Vvf1 in a previous verify operation between the memory cells MCb and MCc to be programmed to the first program state PV1, to a first level at step S211; and precharging a bit line coupled to the memory cell MCc, determined to have a threshold voltage higher than the first verify voltage Vvf1 in the previous verify operation between the memory cells MCb and MCc to be programmed to the first program state PV1, and bit lines coupled to the memory cells MCa and MCd to be programmed to the remaining program states E and PV2, to a second level at step S221. Although, in FIG. 12A, step S221 is illustrated as being performed after step S211 is performed, this is only an example, and the present disclosure is not limited thereto. For example, step S211 may be performed after step S221 is performed, and steps S211 and S221 may be substantially simultaneously performed.

At step S211, only the bit line coupled to a memory cell that absolutely requires the verify operation using the first verify voltage, that is, the memory cell MCb, may be precharged to the first voltage level.

Meanwhile, at step S221, the bit lines BL1, BL3, and BLm coupled to all of the remaining memory cells MCa, MCc, and MCd, other than the memory cell MCb determined to have a threshold voltage lower than the first verify voltage Vvf1 in the previous verify operation between the memory cells MCb and MCc to be programmed to the first program state PV1, may be precharged to the second voltage level lower than the first voltage level.

Referring to FIG. 12B, a first precharge current $I_{PCH1}$ flows through the bit line BL2 coupled to the memory cell MCb determined to have the threshold voltage lower than the first verify voltage Vvf1 in the previous verify operation, among the memory cells to be programmed to the first program state PV1, and a second precharge current $I_{PCH2}$ flows through the bit lines BL1, BL3, and BLm coupled to all of the remaining memory cells MCa, MCc, and MCd. The second precharge current $I_{PCH2}$ has a value lower than that of the first precharge current $I_{PCH1}$.

In accordance with the embodiment illustrated in FIGS. 12A and 12B, a relatively high first precharge current $I_{PCH1}$ flows only through the second bit line BL2 coupled to the memory cell that absolutely requires the verify operation using the first verify voltage, that is, the memory cell MCb, and a relatively low second precharge current $I_{PCH2}$ flows through the remaining bit lines BL1, BL3, and BLm. Accordingly, current consumed in the verify operation using the first verify voltage Vvf1 may be reduced or minimized.

Figure 13A:
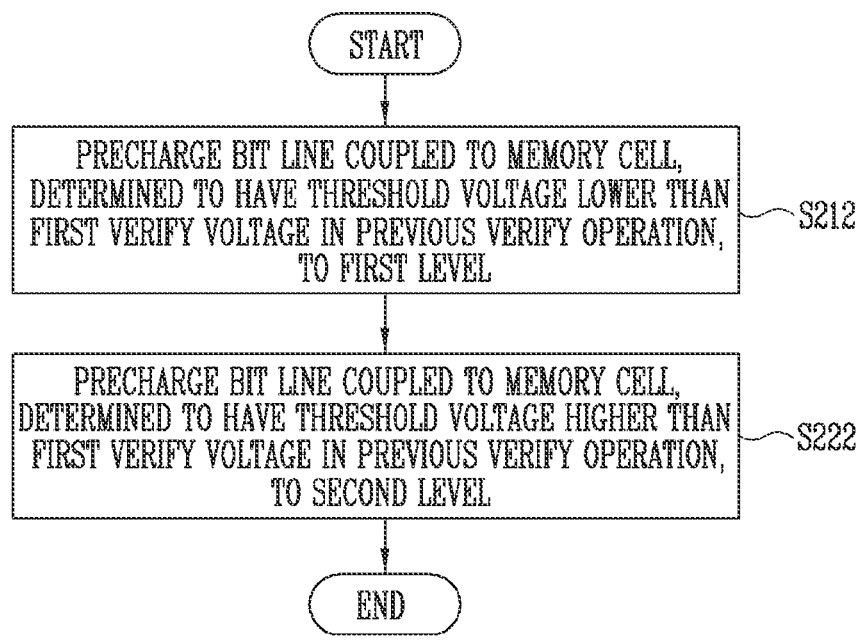
FIG. 13A is a flowchart illustrating an example of step S115 of FIG. 10.
Figure 13B:
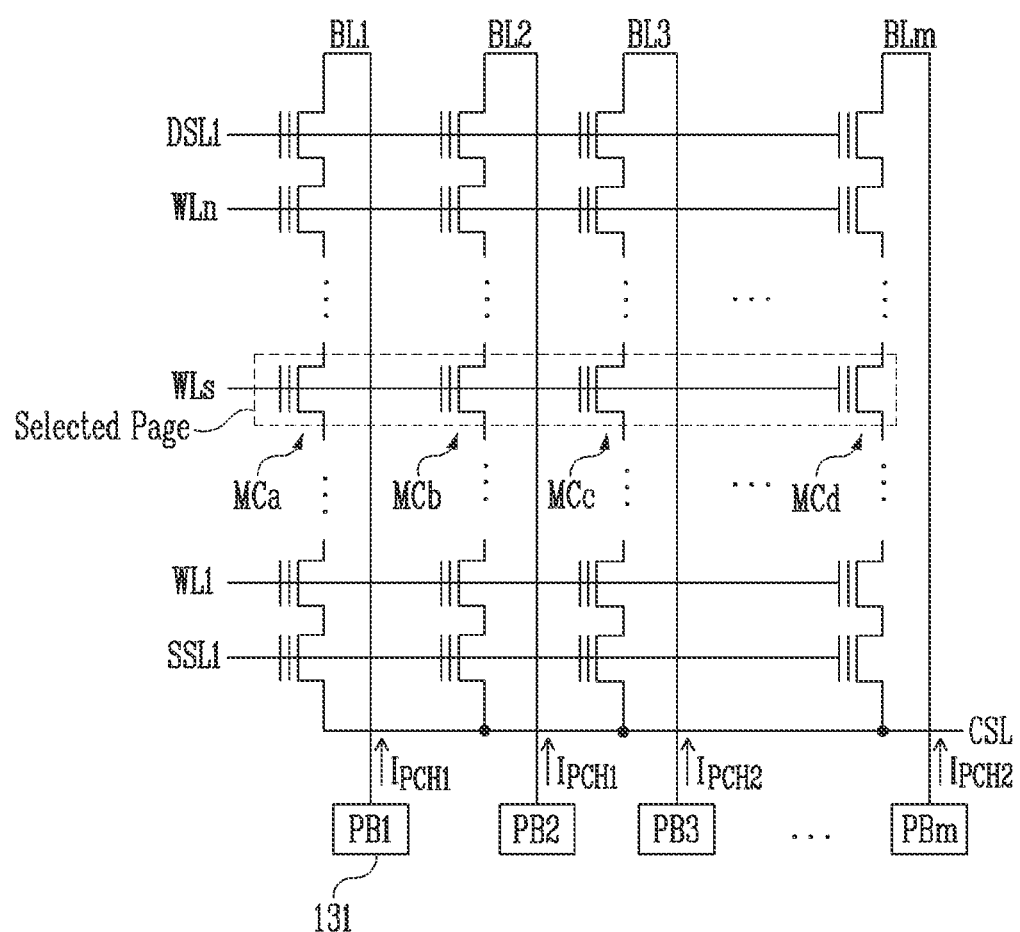
FIG. 13B is a circuit diagram for describing currents flowing through respective bit lines during the operation of the semiconductor memory device at steps S212 and S222 of FIG. 13A.

FIG. 13A is a flowchart illustrating an example of step S115 of FIG. 10. FIG. 13B is a circuit diagram for describing currents flowing through respective bit lines during the operation of the semiconductor memory device at steps S212 and S222 of FIG. 13A.

Referring to FIG. 13A, step S115 from FIG. 10 of precharging the bit lines respectively coupled to the memory cells included in the selected page to different voltage levels may include: precharging bit lines coupled to the memory cells MCa and MCb, determined to have threshold voltages lower than the first verify voltage Vvf1 in a previous verify operation, to a first level at step S212; and precharging bit lines coupled to the memory cells MCc and MCd, determined to have threshold voltages higher than the first verify voltage Vvf1 in the previous verify operation, to a second level at step S222. Although, in FIG. 13A, step S222 is illustrated as being performed after step S212 is performed, this is only an example, and the present disclosure is not limited thereto. For example, step S212 may be performed after step S222 is performed, and steps S212 and S222 may be substantially simultaneously performed.

At step S212, regardless of the target program states of respective memory cells, bit lines BL1 and BL2 coupled to the memory cells MCa and MCb having threshold voltages lower than the first verify voltage Vvf1 may be precharged to the first voltage level.

Meanwhile, at step S222, regardless of the target program states of respective memory cells, bit lines BL3 and BLm coupled to the memory cells MCc and MCd having threshold voltages higher than the first verify voltage Vvf1 may be precharged to the second voltage level lower than the first voltage level.

Referring to FIG. 13B, a first precharge current $I_{PCH1}$ flows through the bit lines BL1 and BL2 coupled to the memory cells MCa and MCb determined to have the threshold voltages lower than the first verify voltage Vvf1 in the previous verify operation, and a second precharge current $I_{PCH2}$ flows through the bit lines BL3 and BLm coupled to the memory cells MCc and MCd determined to have threshold voltages higher than the first verify voltage Vvf1 in the previous verify operation.

Figure 14A:
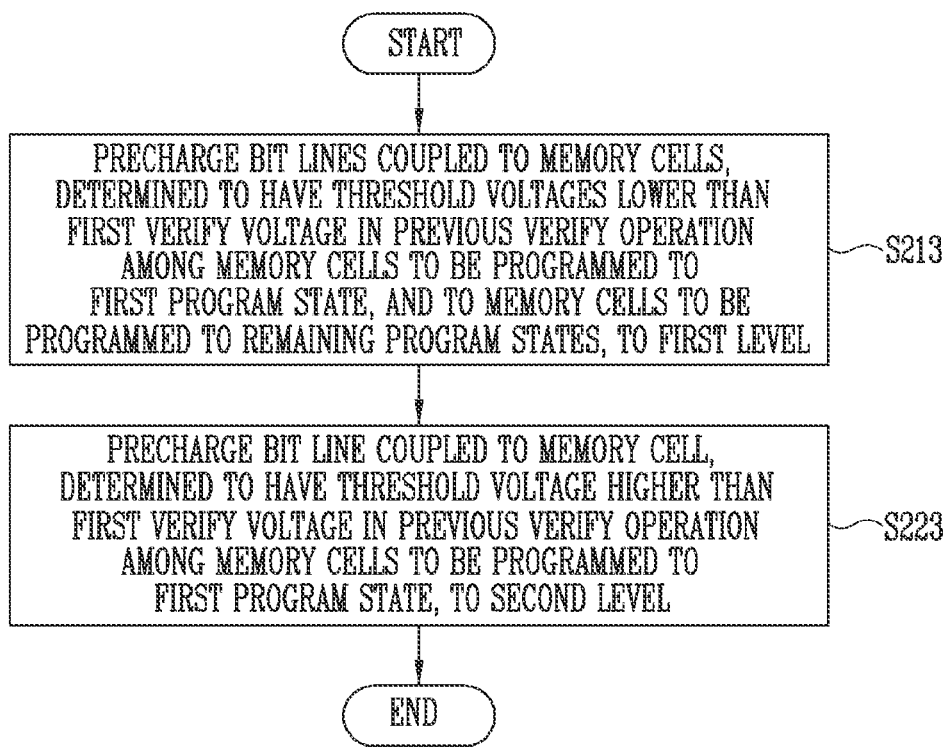
FIG. 14A is a flowchart illustrating an example of step S115 of FIG. 10.
Figure 14B:
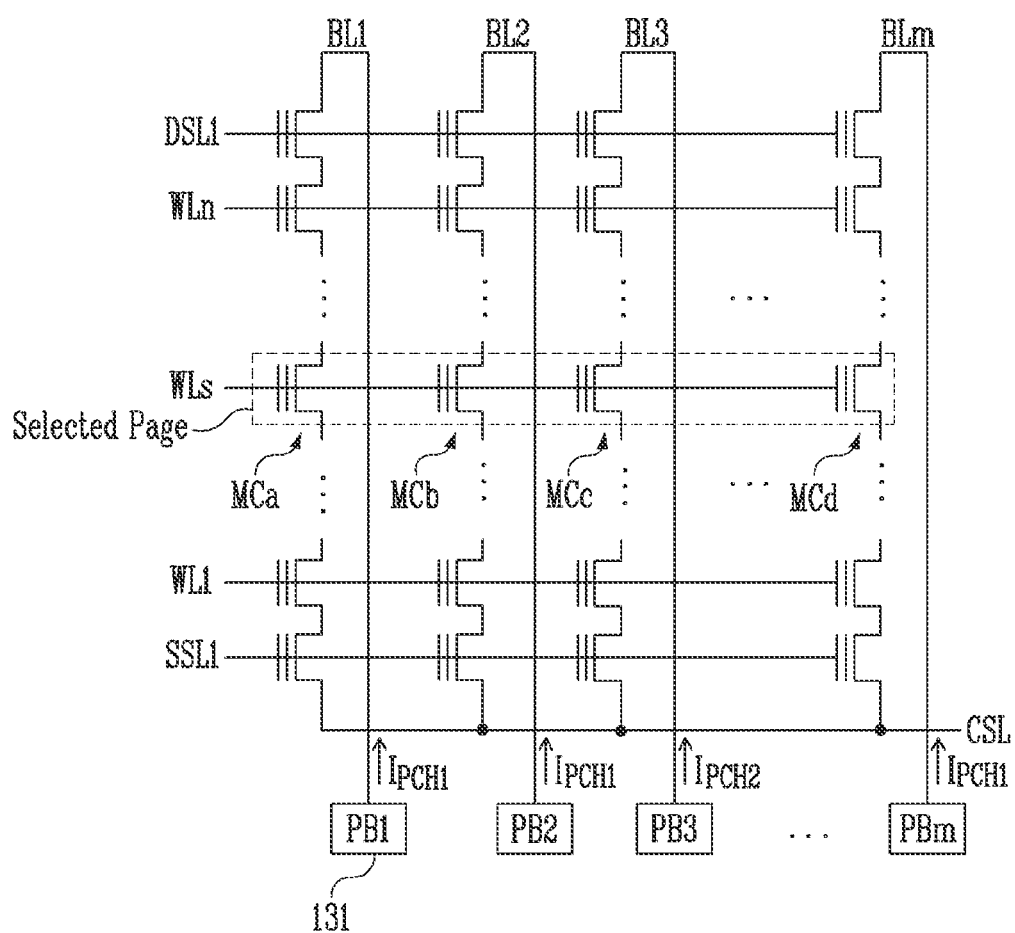
FIG. 14B is a circuit diagram for describing currents flowing through respective bit lines during the operation of the semiconductor memory device at steps S213 and S223 of FIG. 14A.

FIG. 14A is a flowchart illustrating an example of step S115 of FIG. 10. FIG. 14B is a circuit diagram for describing currents flowing through respective bit lines during the operation of the semiconductor memory device at steps S213 and S223 of FIG. 14A.

Referring to FIG. 14A, step S115 from FIG. 10 of precharging the bit lines respectively coupled to the memory cells included in the selected page to different voltage levels may include: precharging bit lines BL2, BL1, and BLm coupled to the memory cell MCb, determined to have a threshold voltage lower than the first verify voltage Vvf1 in a previous verify operation between the memory cells MCb and MCc to be programmed to the first program state PV1, and the memory cells MCa and MCd to be programmed to the remaining program states E and PV2, to a first level at step S213; and precharging a bit line BL3 coupled to the memory cell MCc, determined to have a threshold voltage higher than the first verify voltage Vvf1 in the previous verify operation between the memory cells MCb and MCc to be programmed to the first program state PV1, to a second level at step S223. Although, in FIG. 14A, step S223 is illustrated as being performed after step S213 is performed, this is only an example, and the present disclosure is not limited thereto. For example, step S213 may be performed after step S223 is performed, and steps S213 and S223 may be substantially simultaneously performed.

Referring to FIG. 14B, a first precharge current $I_{PCH1}$ flows through the bit lines BL2, BL1, and BLm coupled to the memory cell MCb determined to have the threshold voltage lower than the first verify voltage Vvf1 in the previous verify operation, among the memory cells to be programmed to the first program state PV1, and to the memory cells MCa and MCd to be programmed to the remaining program states E and PV2. Further, a second precharge current $I_{PCH2}$ flows through the bit line BL3 coupled to the memory cell MCc, determined to have a threshold voltage higher than the first verify voltage Vvf1 in the previous verify operation, among the memory cells to be programmed to the first program state PV1. The second precharge current $I_{PCH2}$ has a value lower than the first precharge current $I_{PCH1}$.

Figure 15:
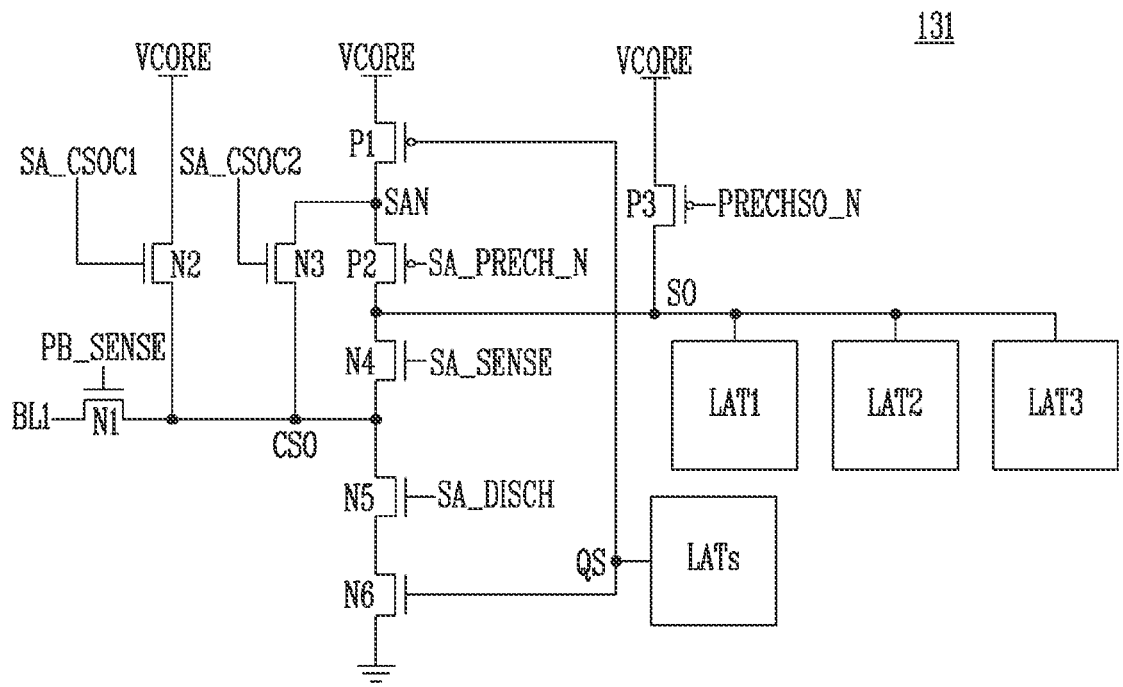
FIG. 15 is a circuit diagram illustrating an example of the configuration of a page buffer.

FIG. 15 is a circuit diagram illustrating an example of the configuration of a page buffer.

A page buffer 131 may be operated in response to a signal output from control logic 140. Signals PB_SENSE, SA_PRECH_N, SA_SENSE, SA_CSOC1, SA_CSOC2, SA_DISCH, and PRECHSO_N, which will be described below, may be control signals output from the control logic 140. The page buffer 131 will be described in detail below.

Referring to FIG. 15, the page buffer 131 is coupled to a memory cell through a bit line BL1. Also, the page buffer 131 may include first to sixth NMOS transistors N1 to N6 and first to third PMOS transistors P1 to P3. Further, the page buffer 131 may include a control latch LATs and first to third latches LAT1, LAT2, and LAT3.

The page buffer 131 may perform a bit line precharge operation of charging the bit line BL1 with charges supplied from a supply voltage source VCORE. Also, the page buffer 131 may discharge the bit line BL1, charged with the charges, to a ground voltage through the first NMOS transistor N1, the fifth NMOS transistor N5, and the sixth NMOS transistor N6.

The first NMOS transistor N1 is coupled between the bit line BL1 and a common node CSO. The first PMOS transistor P1 is coupled between the supply voltage source VCORE and a sense amplifier (AMP) node SAN. The second NMOS transistor N2 is coupled between the supply voltage source VCORE and the common node CSO. The third NMOS transistor N3 is coupled between the common node CSO and the sense AMP node SAN. The second PMOS transistor P2 is coupled between the sense AMP node SAN and a sensing node SO. The fourth NMOS transistor N4 is coupled between the sensing node SO and the common node CSO. The third PMOS transistor P3 is coupled between the supply voltage source VCORE and the sensing node SO. The fifth and sixth NMOS transistors N5 and N6 are coupled in series between the common node CSO and a ground voltage source.

The first NMOS transistor N1 is controlled in response to a page buffer sensing signal PB_SENSE, the second NMOS transistor N2 is controlled in response to a first current sensing signal SA_CSOC1, the third NMOS transistor N3 is controlled in response to a second current sensing signal SA_CSOC2, and the fourth NMOS transistor N4 is controlled in response to a sense AMP sensing signal SA_SENSE. Further, the fifth NMOS transistor N5 is controlled in response to a sense AMP discharge signal SA_DISCH, and the sixth NMOS transistor N6 and the first PMOS transistor P1 are controlled in response to the voltage of a node QS of the control latch LATs. The second PMOS transistor P2 is controlled in response to a sense AMP precharge signal SA_PRECH_N and the third PMOS transistor P3 is controlled in response to a sensing node precharge signal PRECHSO_N. That is, the page buffer sensing signal PB_SENSE may be applied to a gate of the first NMOS transistor N1, the first current sensing signal SA_CSOC1 may be applied to a gate of the second NMOS transistor N2, the second current sensing signal SA_CSOC2 may be applied to a gate of the third NMOS transistor N3, and the sense AMP sensing signal SA_SENSE may be applied to a gate of the fourth NMOS transistor N4. Furthermore, the sense AMP discharge signal SA_DISCH may be applied to a gate of the fifth NMOS transistor N5, and the voltage of the node QS of the control latch LATs may be applied to gates of the sixth NMOS transistor N6 and the first PMOS transistor P1. The sense AMP precharge signal SA_PRECH_N may be applied to a gate of the second PMOS transistor P2, and the sensing node precharge signal PRECHSO_N may be applied to a gate of the third PMOS transistor P3.

The first current sensing signal SA_CSOC1 and the second current sensing signal SA_CSOC2 may be enabled during a verify operation using a first verify voltage Vvf1. In accordance with an embodiment of the present disclosure, the enable voltage level of the first current sensing signal SA_CSOC1 is lower than that of the second current sensing signal SA_CSOC2. Also, during the verify operation using the first verify voltage Vvf1, the control latch LATs of the page buffer coupled to the bit line to be precharged to a first voltage level may be designated to store a value of "0". On the other hand, during the verify operation using the first verify voltage Vvf1, the control latch LATs of the page buffer coupled to the bit line to be precharged to a second voltage level, lower than the first voltage level, may be designated to store a value of "1".

When a value of "0" is stored in the control latch LATs, the voltage of the node QS is a logic low voltage, and thus the first PMOS transistor P1 is turned on. Because the second current sensing signal SA_CSOC2 makes a transition to a logic high state, the third NMOS transistor N3 is also turned on. Meanwhile, because the first current sensing signal SA_CSOC1 makes a transition to a logic high state, the second NMOS transistor N2 is also turned on. In this case, the bit line BL1 is precharged through a first path formed from the supply voltage source VCORE to pass through the second NMOS transistor N2 and the first NMOS transistor N1, and a second path formed from the supply voltage source VCORE to pass through the first PMOS transistor P1, the third NMOS transistor N3, and the first NMOS transistor N1. Accordingly, the bit line BL1 is precharged to the first level that is relatively high.

When a value of "1" is stored in the control latch LATs, the voltage of the node QS is a logic high voltage, and thus the first PMOS transistor P1 is turned off. Therefore, the second path formed from the supply voltage source VCORE to pass through the first PMOS transistor P1, the third NMOS transistor N3, and the first NMOS transistor N1 is disabled. Therefore, the bit line BL1 is precharged through the first path formed from the supply voltage source VCORE to pass through the second NMOS transistor N2 and the first NMOS transistor N1. Because the enable voltage level of the first current sensing signal SA_CSOC1 is a relatively low value, the second NMOS transistor N2 included in the first path is weakly turned on. Accordingly, the bit line BL1 is precharged to the second level that is relatively low.

Figure 16:
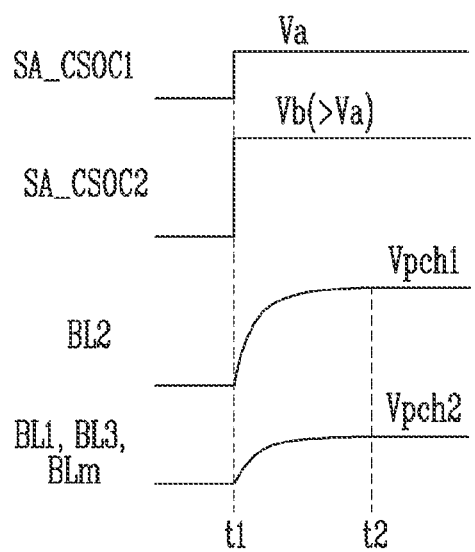
FIG. 16 is a timing diagram for describing an example of the operation of the page buffer illustrated in FIG. 15.

FIG. 16 is a timing diagram for describing an example of the operation of the page buffer illustrated in FIG. 15. In FIG. 16, an example in which a value of "0" is stored in the control latch of a page buffer coupled to a second bit line BL2 and a value of "1" is stored in the control latches of page buffers coupled to a first bit line BL1, a third bit line BL3, and an m-th bit line BLm is illustrated.

Referring to FIG. 16, the first current sensing signal SA_CSOC1 and the second current sensing signal SA_CSOC2 may be enabled at time t1 during a verify operation. As illustrated in FIG. 16, the enable voltage level Va of the first current sensing signal SA_CSOC1 may be lower than the enable voltage level Vb of the second current sensing signal SA_CSOC2.

Because the value of "0" is stored in the control latch LATs of the page buffer coupled to the second bit line BL2, the second bit line BL2 is precharged through the first path and the second path. Accordingly, the voltage of the second bit line BL2 may rapidly rise to a first precharge level Vpch1 during a period from t1 to t2. That is, during the period from t1 to t2, a relatively high first precharge current $I_{PCH1}$ flows through the second bit line BL2.

Because the value of "1" is stored in the control latches of the page buffers coupled to the first bit line BL1, the third bit line BL3, and the m-th bit line BLm, the first bit line BL1, the third bit line BL3, and the m-th bit line BLm are precharged through the first path. As described above, the second NMOS transistor N2 included in the first path is weakly turned on. Accordingly, the voltages of the first bit line BL1, the third bit line BL3, and the m-th bit line BLm may slowly rise to a second precharge level Vpch2 during the period from t1 to t2. That is, during the period from t1 to t2, a relatively low second precharge current $I_{PCH2}$ flows through the first bit line BL1, the third bit line BL3, and the m-th bit line BLm. Consequently, current consumed in the bit line precharge operation may be reduced. Accordingly, power consumed in the verify operation included in the program operation of the semiconductor memory device may be minimized.

Furthermore, the embodiments disclosed in the present specification and the drawings aims to help those with ordinary knowledge in this art more clearly understand the present disclosure rather than aiming to limit the bounds of the present disclosure. Therefore, one of ordinary skill in the art to which the present disclosure belongs will understand that various modifications are possible based on the technical scope of the present disclosure.

The present disclosure may provide a semiconductor memory device that is capable of reducing or minimizing current required for a program operation, and a method of operating the semiconductor memory device.

What is claimed is:

1. A semiconductor device, comprising:
a memory cell array including a plurality of memory cells;
a peripheral circuit configured to perform a program operation on memory cells selected from among the plurality of memory cells; and
control logic configured to control the program operation of the peripheral circuit,
wherein the control logic controls the peripheral circuit to precharge bit lines respectively coupled to the selected memory cells to different voltage levels during a verify operation included in the program operation,
wherein the control logic:
determines a first memory cell which has a threshold voltage lower than a verify voltage among the selected memory cells to be programmed to a program state corresponding to the verify voltage based on a result of a previous verify operation which is performed before the verify operation using the verify voltage; and
controls the peripheral circuit to precharge a bit line coupled to the first memory cell to a first level and precharge bit lines coupled to remaining memory cells other than the first memory cell, among the selected memory cells, to a second level lower than the first level.

2. The semiconductor device according to claim 1, wherein the control logic controls the peripheral circuit to:
   precharge the bit line coupled to the first memory cell, determined to have the threshold voltage lower than the verify voltage in the previous verify operation among the selected memory cells to be programmed to the program state corresponding to the verify voltage, to the first level, and
   precharge a bit line coupled to a memory cell, determined to have a threshold voltage higher than the verify voltage in the previous verify operation, to the second level.

3. The semiconductor device according to claim 1, wherein the control logic controls the peripheral circuit to:
   precharge a bit line coupled to a second memory cell, determined to have a threshold voltage higher than the verify voltage in the previous verify operation among the selected memory cells to be programmed to the program state corresponding to the verify voltage, to the second level, and
   precharge bit lines coupled to remaining memory cells other than the second memory cell, among the selected memory cells, to the first level.

4. The semiconductor device according to claim 1, wherein the peripheral circuit comprises a plurality of page buffers respectively coupled to the bit lines, each page buffer comprising:
   a first NMOS transistor coupled to a corresponding bit line and a first node and controlled in response to a first control signal;
   a second NMOS transistor coupled between a supply voltage source and the first node and controlled in response to a second control signal;
   a first PMOS transistor coupled between the supply voltage source and a second node;
   a third NMOS transistor coupled between the first node and the second node and controlled in response to a third control signal; and
   a control latch coupled to a gate of the first PMOS transistor,
   wherein a first value is stored in a control latch of a page buffer coupled to the bit line coupled to the memory cell that requires the verify operation, and
   wherein a second value different from the first value is stored in a control latch of a page buffer coupled to a bit line coupled to each memory cell that does not require the verify operation.

5. The semiconductor device according to claim 4, wherein:
   during the verify operation, each of the first control signal, the second control signal, and the third control signal is enabled to a logic high state, and
   an enable voltage level of the second control signal is lower than an enable voltage level of the third control signal.

6. The semiconductor device according to claim 5, wherein:
   when the first value is stored in the control latch, the first PMOS transistor is turned on, and
   when the second value is stored in the control latch, the first PMOS transistor is turned off.

7. The semiconductor device according to claim 6, wherein each of the plurality of page buffers further comprises:

a second PMOS transistor coupled between the second node and a third node;
   a third PMOS transistor coupled between the supply voltage source and the third node;
   a fourth NMOS transistor coupled between the first node and the third node;
   a fifth NMOS transistor coupled between the first node and a fourth node; and
   a sixth NMOS transistor coupled between the fourth node and a ground voltage source,
   wherein a gate of the sixth NMOS transistor is coupled to the control latch.

8. The semiconductor device according to claim 7, wherein each of the plurality of page buffers further comprises:
   at least one latch coupled to the third node.

9. A method of operating a semiconductor device, the method comprising:
   determining a first memory cell which has a threshold voltage lower than a verify voltage among memory cells to be programmed to a program state corresponding to the verify voltage based on a result of a previous verify operation which is performed before a verify operation using the verify voltage;
   precharging bit lines respectively coupled to the memory cells included in a selected page to different voltage levels;
   applying the verify voltage to a word line coupled to the memory cells included in the selected page; and
   sensing whether threshold voltages of the memory cells included in the selected page are higher than the verify voltage,
   wherein precharging the bit lines comprises:
   precharging a bit line coupled to the first memory cell to a first level; and
   precharging bit lines coupled to remaining memory cells other than the first memory cell, among the memory cells included in the selected page, to a second level lower than the first level.

10. The method according to claim 9, wherein precharging the bit lines comprises:
    precharging a bit line coupled to a memory cell, determined to have a threshold voltage lower than the verify voltage in the previous verify operation to the first level; and
    precharging a bit line coupled to a memory cell, determined to have a threshold voltage higher than the verify voltage in the previous verify operation, to the second level lower than the first level.

11. The method according to claim 9, wherein precharging the bit lines comprises:
    precharging bit lines coupled to a memory cell, determined to have a threshold voltage lower than the verify voltage in the previous verify operation among the memory cells to be programmed to the program state corresponding to the verify voltage, and to memory cells to be programmed to remaining program states, to the first level; and
    precharging a bit line coupled to a memory cell, determined to have a threshold voltage higher than the verify voltage in the previous verify operation among the memory cells to be programmed to the program state corresponding to the verify voltage, to a second level lower than the first level.

12. The method according to claim 9, further comprising, after sensing whether the threshold voltages of the memory cells included in the selected page are higher than the verify voltage:
- updating result of the verify operation corresponding to the verify voltage; and
- determining whether verification for the program state corresponding to the verify voltage has passed based on the updated verification result.

* * * * *